United States Patent
Lu et al.

(10) Patent No.: US 11,086,227 B2
(45) Date of Patent: *Aug. 10, 2021

(54) METHOD TO MITIGATE DEFECT PRINTABILITY FOR ID PATTERN

(71) Applicant: Taiwan Semiconductor Manufacturing Company, Ltd., Hsin-Chu (TW)

(72) Inventors: Yen-Cheng Lu, New Taipei (TW); Chia-Hao Hsu, Hsinchu (TW); Shinn-Sheng Yu, Hsinchu (TW); Chia-Chen Chen, Hsinchu (TW); Jeng-Horng Chen, Hsinchu (TW); Anthony Yen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/899,915

(22) Filed: Jun. 12, 2020

(65) Prior Publication Data

US 2020/0310250 A1    Oct. 1, 2020

Related U.S. Application Data

(62) Division of application No. 15/971,181, filed on May 4, 2018, now Pat. No. 10,684,552, which is a division of application No. 14/448,677, filed on Jul. 31, 2014, now Pat. No. 9,964,850.

(51) Int. Cl.
*G03F 7/20* (2006.01)
*G02B 26/06* (2006.01)

(52) U.S. Cl.
CPC ........ *G03F 7/70258* (2013.01); *G03F 7/7065* (2013.01); *G03F 7/70158* (2013.01); *G03F 7/70191* (2013.01); *G03F 7/70308* (2013.01); *G02B 26/06* (2013.01); *G03F 7/70033* (2013.01); *G03F 7/70466* (2013.01)

(58) Field of Classification Search
CPC ............. G03F 7/70258; G03F 7/70308; G03F 7/70191; G03F 7/70158
See application file for complete search history.

(56) References Cited

U.S. PATENT DOCUMENTS

| | | | |
|---|---|---|---|
| 4,559,931 A | 12/1985 | Fischell | |
| 4,881,530 A | 11/1989 | Trick | |
| 5,436,114 A | 7/1995 | Itoo et al. | |
| 6,821,682 B1 | 11/2004 | Stearns et al. | |
| 7,867,162 B2 | 1/2011 | Morningstar | |
| 7,946,975 B2 | 5/2011 | George et al. | |
| 8,142,958 B2 | 3/2012 | Holfeld | |
| 8,241,203 B2 | 8/2012 | Fogarty | |
| 8,376,930 B2 | 2/2013 | Abdelmalek | |
| 8,628,897 B1 | 1/2014 | Lu et al. | |
| 9,261,774 B2 | 2/2016 | Lu et al. | |
| 9,442,384 B2 | 9/2016 | Lu et al. | |
| 9,535,334 B2 | 1/2017 | Lu et al. | |
| 9,964,850 B2 | 5/2018 | Lu et al. | |
| 2007/0022402 A1 | 1/2007 | Ye et al. | |
| 2012/0200838 A1 | 8/2012 | De Winter et al. | |

FOREIGN PATENT DOCUMENTS

| | | |
|---|---|---|
| CN | 101005026 | 7/2007 |
| JP | 2010266900 | 11/2010 |
| KR | 20030042536 | 6/2003 |
| KR | 201000355559 | 4/2010 |
| WO | WO 00/34828 | 6/2000 |

OTHER PUBLICATIONS

Korean Patent and Trademark Office, Korean Patent Office Action dated Mar. 14, 2016, for Application No. 10 2014 0188080, 14 pages.

*Primary Examiner* — Daborah Chacko-Davis
(74) *Attorney, Agent, or Firm* — Haynes and Boone, LLP

(57) ABSTRACT

Various methods are disclosed herein for reducing (or eliminating) printability of mask defects during lithography processes. An exemplary method includes performing a first lithography exposing process and a second lithography exposing process using a mask to respectively image a first set of polygons oriented substantially along a first direction and a second set of polygons oriented substantially along a second direction on a target. During the first lithography exposing process, a phase distribution of light diffracted from the mask is dynamically modulated to defocus any mask defect oriented at least partially along both the first direction and a third direction that is different than the first direction. During the second lithography exposing process, the phase distribution of light diffracted from the mask is dynamically modulated to defocus any mask defect oriented at least partially along both the second direction and a fourth direction that is different than the third direction.

20 Claims, 10 Drawing Sheets

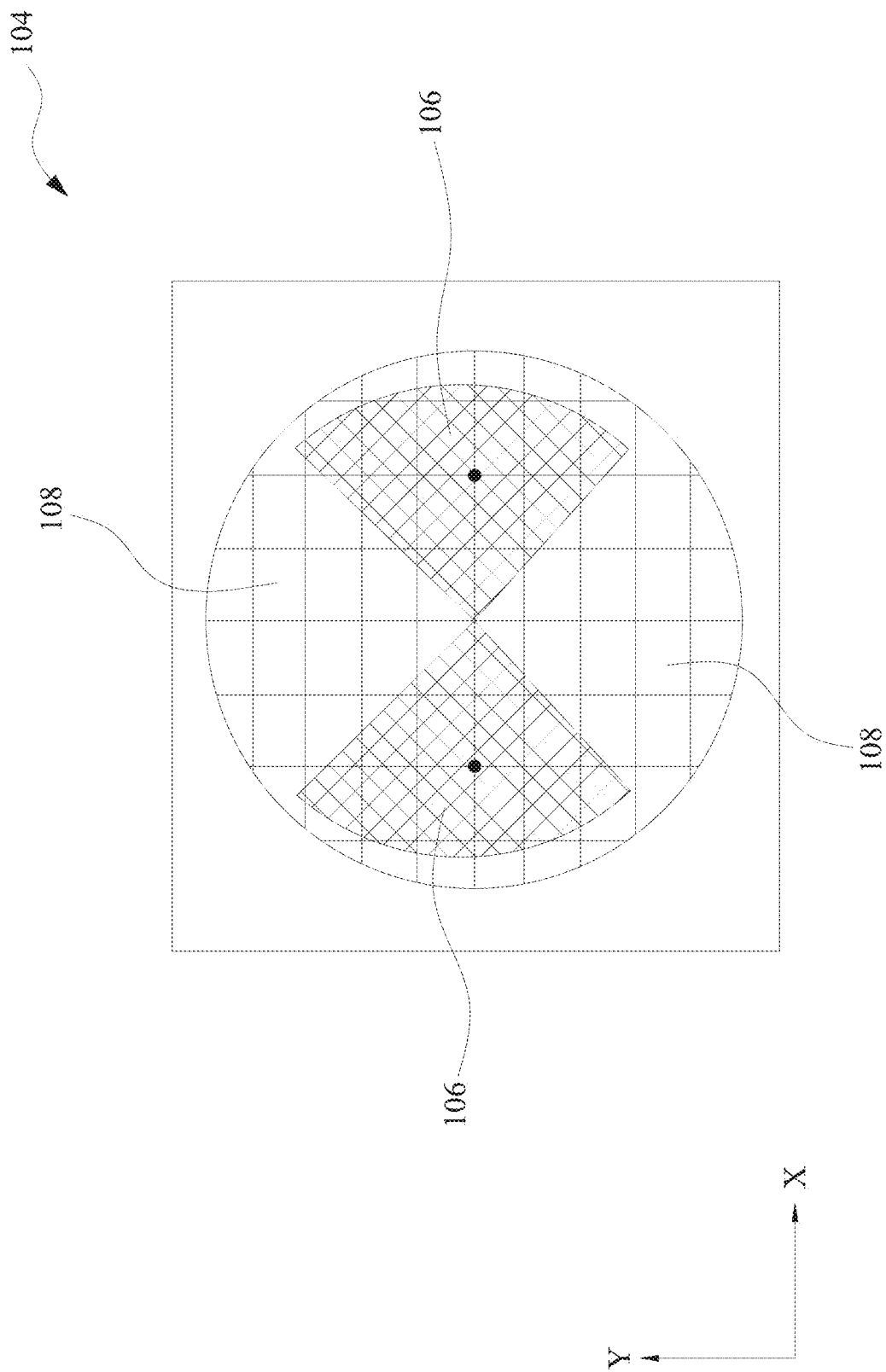

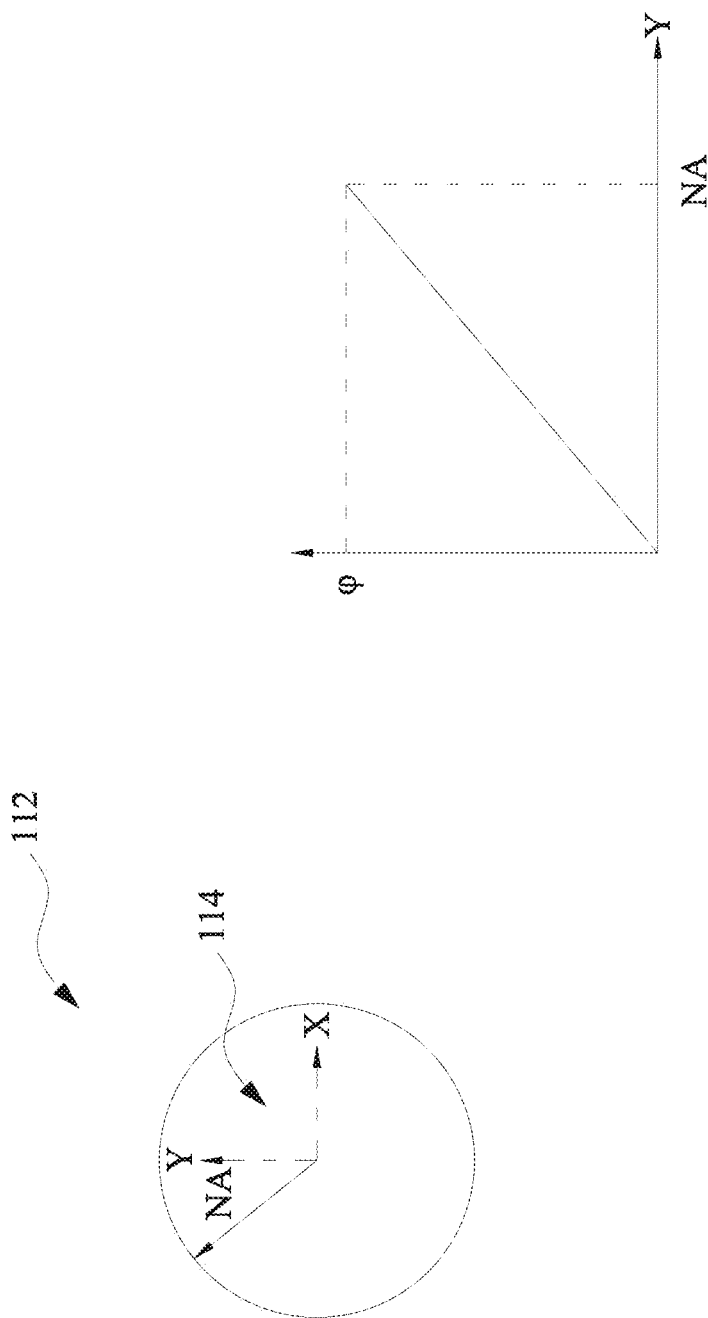

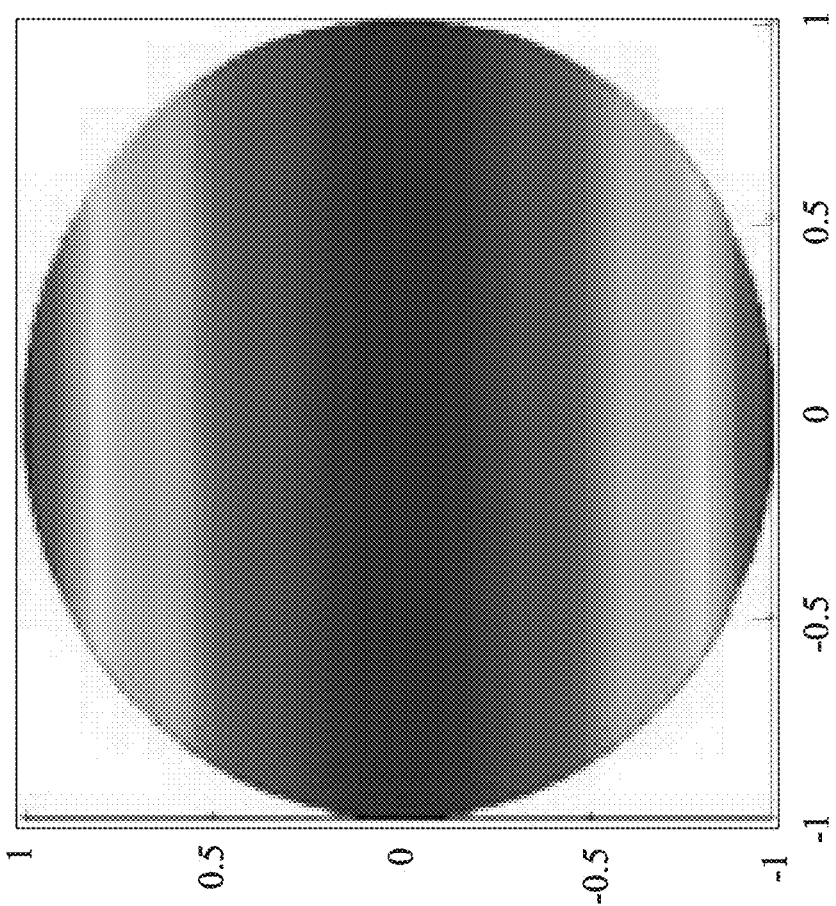
Fig. 8
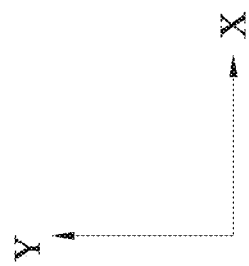

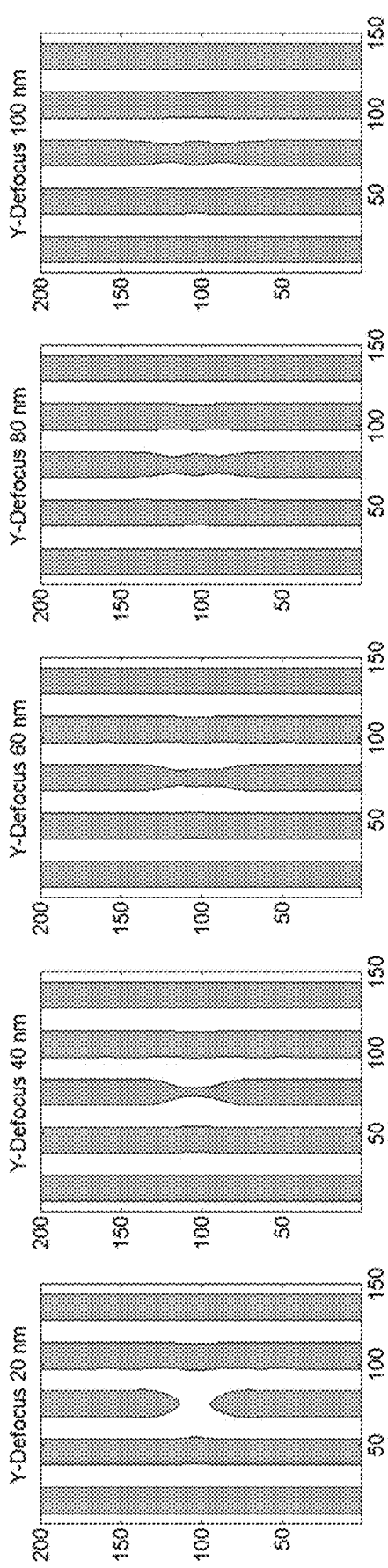
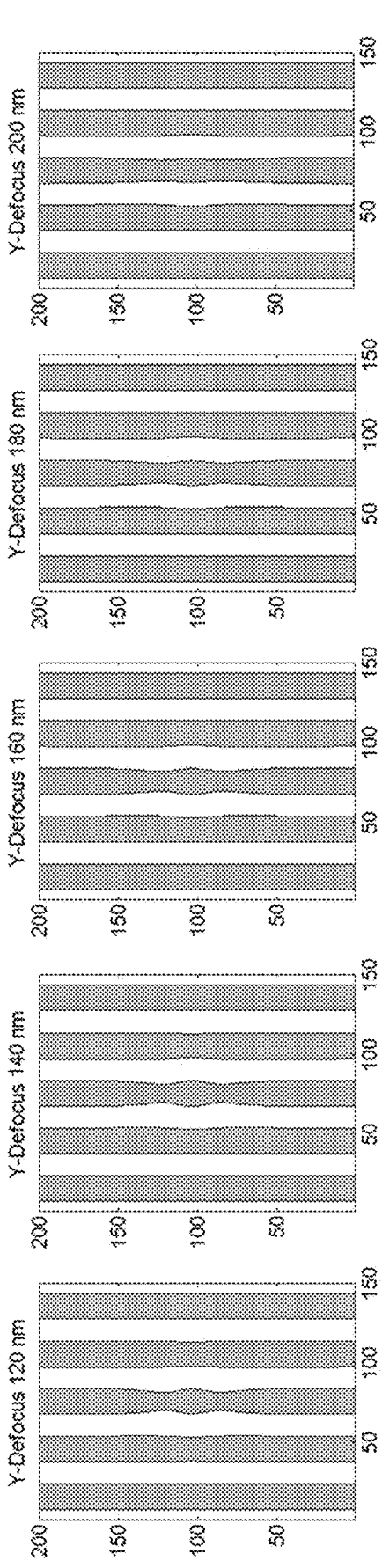
Fig. 10B Fig. 10C Fig. 10D Fig. 10E Fig. 10F
Fig. 10G Fig. 10H Fig. 10I Fig. 10J Fig. 10K s
METHOD TO MITIGATE DEFECT PRINTABILITY FOR 1D PATTERN The present application is a divisional application of U.S. patent application Ser. No. 15/971,181, filed May 4, 2018, now U.S. Pat. No. 10,684,552, which is a divisional application of U.S. patent application Ser. No. 14/448,677, filed Jul. 31, 2014, now U.S. Pat. No. 9,964,850, the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) are employed in EUVL for fabricating integrated circuits. EUVL is very similar to optical lithography in that it needs a mask to print wafers, except that it employs light in the EUV region, i.e., at 13.5 nm. At the wavelength of 13.5 nm or so, all materials are highly absorbing. Thus, reflective optics rather than refractive optics is used. A multi-layered (ML) structure is used as a EUVL mask blank. However, any microscopic nonflatness on the substrate will deform the films deposited subsequently. A small bump or pit will introduce a defect. The detrimental effect of a mask defect includes magnified errors to a plurality of wafers.

Therefore, what is needed is the method for a lithography process and a lithography system to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a diagrammatic top view of an illuminator used in the lithography system of FIG. 1, constructed in accordance with some embodiments.

FIG. 6 is a diagrammatic top view of a phase distribution utilized by the lithography process of FIG. 4, constructed in accordance with some embodiments.

FIG. 7 illustrates a phase distribution utilized in the lithography process of FIG. 4, constructed in accordance with some embodiments.

FIG. 8 is a diagrammatic top view of a phase distribution utilized by the lithography process of FIG. 4, constructed in accordance with some other embodiments.

FIGS. 10A through 10K are diagrammatic top views of mask images on a target, constructed in accordance with some embodiments.

DETAILED DESCRIPTION

Figure 1:
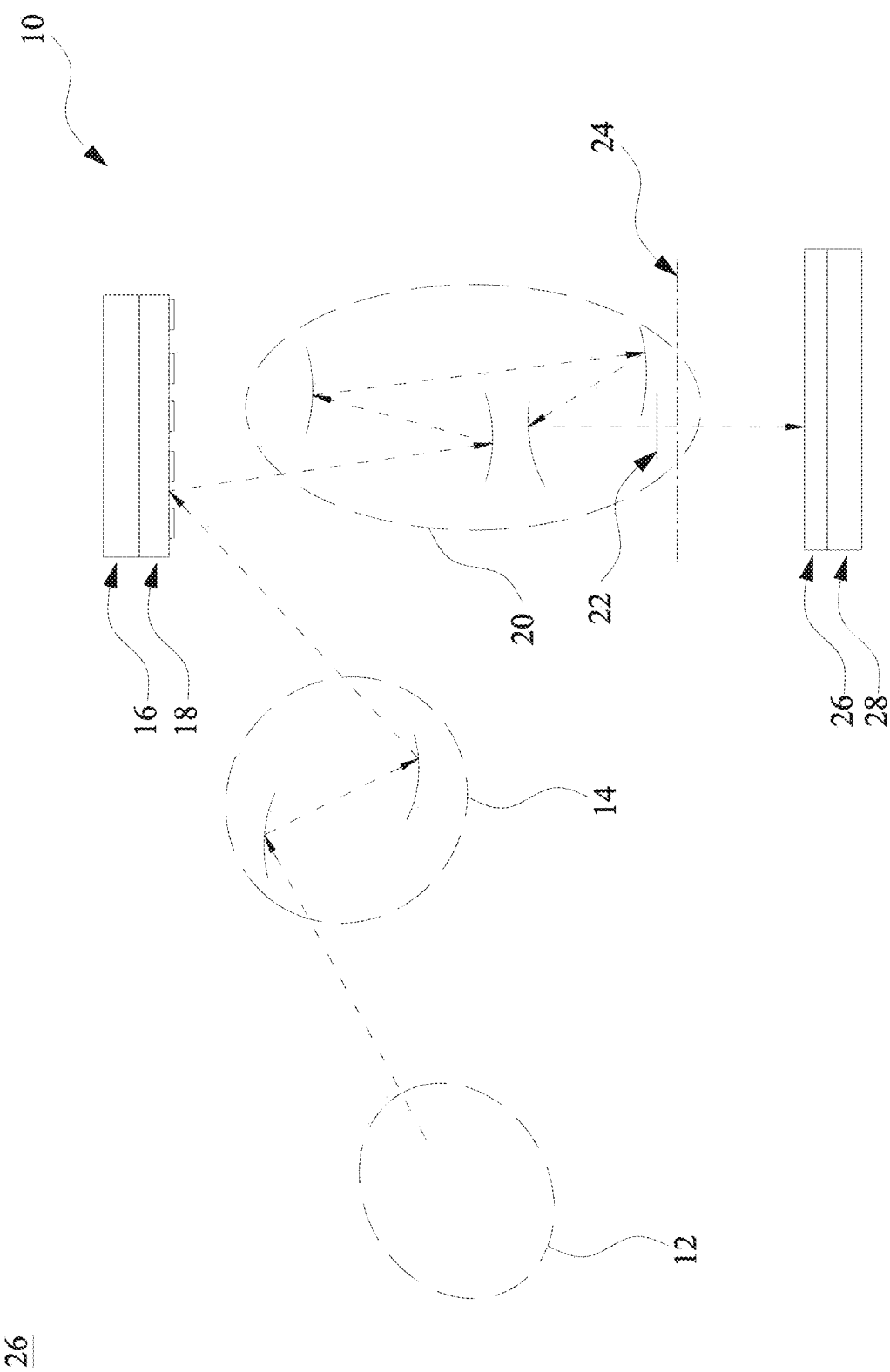
FIG. 1 is a schematic view of a lithography system constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics.

In some embodiments, the illuminator 14 is operable to configure the mirrors to provide a proper illumination to the mask 18. In one example, the mirrors of the illuminator 14 are tunable to reflect EUV light to different illumination positions. In some embodiment, a stage prior to the illuminator 14 may additionally include other tunable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, a dipole illuminator 14 with partial coherence σ being at most 0.3 is employed.

The lithography system 10 also includes a mask stage 16 configured to secure a mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the disclosure, the terms of mask, photomask, and reticle are used exchangeably to refer to the same item. In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 is implemented by tuning the reflective mirrors of the POB 20 for phase modulation. For example, the mirrors of the POB 20 are tunable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light. The pupil phase modulator 22 will be further described later.

The lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present and an incident light is almost fully absorbed by the absorber. In the reflective regions, the absorber is removed and the incident light is reflected by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
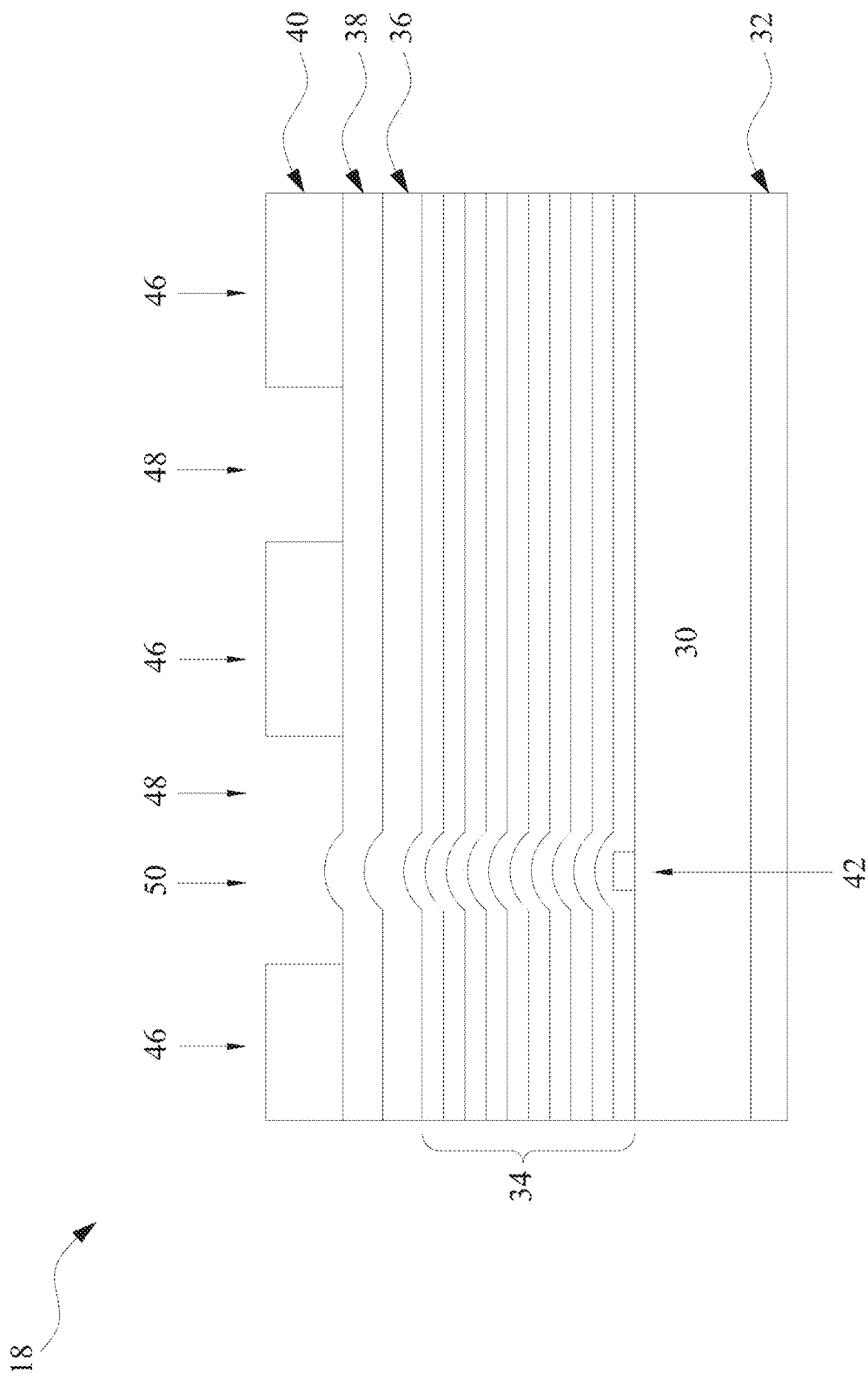
FIG. 2 is a sectional view of a mask constructed in accordance with some embodiments.

One example of the mask 18 is shown in FIG. 2. The mask 18 is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible. The EUV mask 18 includes a reflective multilayer (ML) 34 disposed over the LTEM substrate 30. The ML 34 may be selected such that it provides a high reflectivity to a selected radiation type/wavelength. The ML 34 includes a plurality of film pairs, such as Mo/Si film pairs (e.g., a layer of molybdenum above or below a layer of silicon in each film pair). Alternatively, the ML 34 may include Mo/Be film pairs, or any materials with refractive index difference so being highly reflective at EUV wavelengths. The thickness of each layer of the ML 34 depends on the EUV wavelength and the incident angle. Particularly, the thickness of the ML 34 (and the thicknesses of the film pairs) is adjusted to achieve a maximum constructive interference of the EUV light diffracted at each interface and a minimum absorption of the EUV light by the ML 34.

The EUV mask 18 also includes a capping layer 36 disposed over the ML 34 to prevent oxidation of the ML. In one embodiment, the capping layer 36 includes silicon with a thickness ranging from about 4 am to about 7 nm. The EUV mask 18 may further include a buffer layer 38 disposed above the capping layer 36 to act as an etching stop layer in a patterning or repairing process of an absorption layer, which will be described later. The buffer layer 38 has different etching characteristics from the absorption layer. The buffer layer 38 includes ruthenium (Ru), Ru compounds such as RuB, RuSi, chromium (Cr), Cr oxide, and Cr nitride in various examples.

The EUV mask 18 also includes an absorption layer 40 formed over the buffer layer 38. In the present embodiment, the absorption layer 40 absorbs the EUV radiation directed onto the mask. In various examples, the absorption layer 40 may include chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above.

In an alternative embodiment, the layer 40 is a second reflective layer patterned to form a phase shift mask. In furtherance of the embodiments, the EUV light reflected from the layer 40 and the EUV light reflected from the reflective ML 34 have different light phase, such as about 180 degree phase difference (out of phase). In various embodiments, the second reflective layer has a similar material stack as that of the reflective ML 34, or alternatively a different material stack, such a single film and multiple non-periodic films.

The mask 18 may include an exemplary defect 42 illustrated in FIG. 2. The defect 42 may be a bump (protrusion) or a pit (depression) on the surface of the LTEM substrate 30 (beneath the ML 34) or embedded in the ML 34. The defect 42 may be created during fabricating the LTEM substrate 30, the ML 34, or any other process. For the sake of example, the defect 42 is a bump and has a height of about one fourth of the wavelength of the EUV light from the radiation source 12. In the present example, the defect 42 causes local deformation of all subsequent layers above it.

Figure 3:
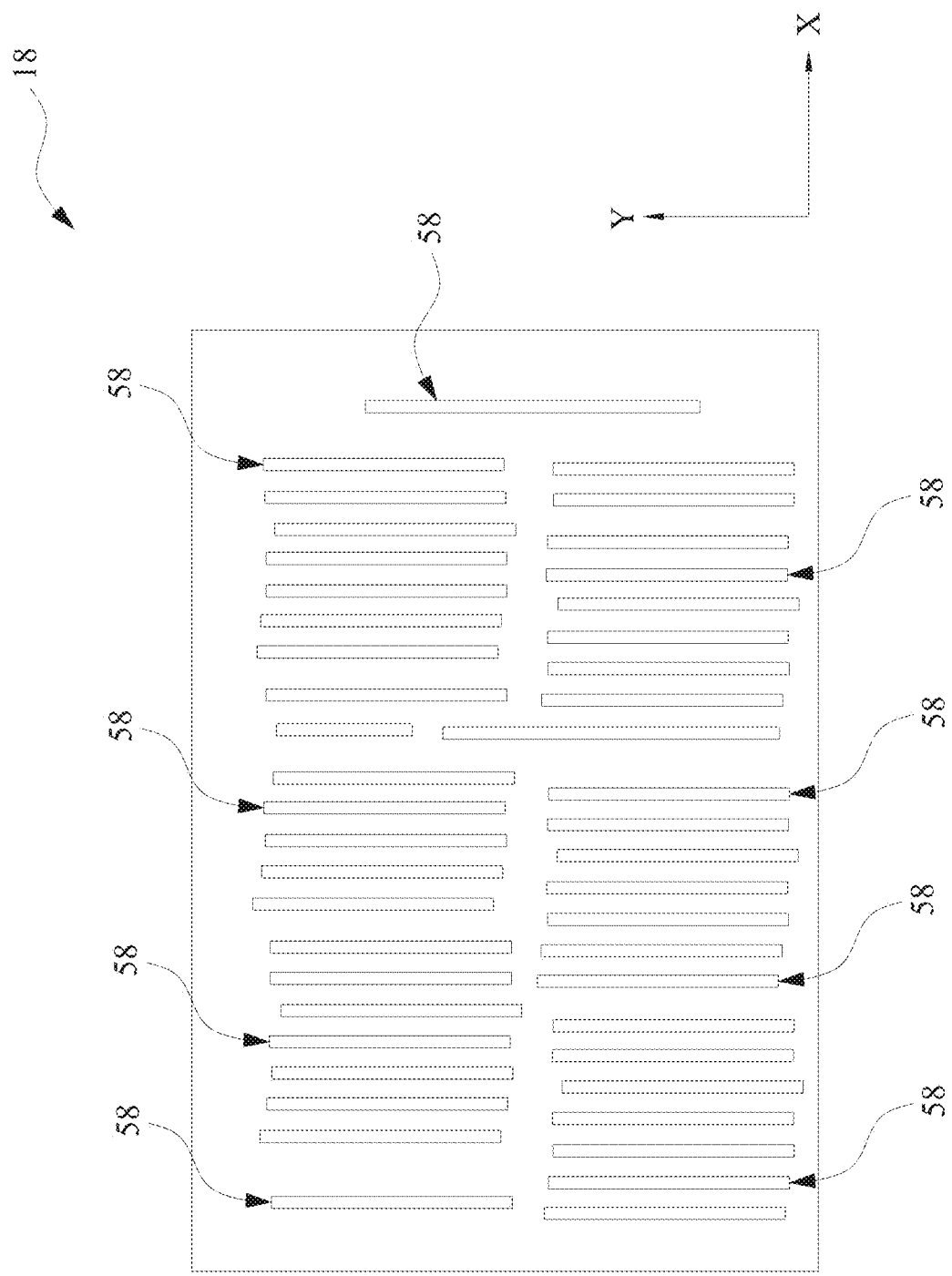
FIG. 3 is a top view of a mask constructed in accordance with some embodiments.

The absorption layer 40 is patterned to form an IC pattern according to design layout. In the present embodiment, the IC pattern formed on the EUV mask 18 is a one-dimension (1D) pattern. For better understanding the 1D pattern, the mask 18 is further illustrated in FIG. 3 as a top view in accordance with some embodiments. The mask 18 includes the IC pattern having a plurality of features (polygons) 58 defined according to the IC design layout. In some embodiments, the polygons 58 are defined in in the layer 40 after the layer 40 is patterned according to the IC design layout. In alternative embodiments, the polygons 58 are defined within the openings of the layer 40 after the layer 40 is patterned. The IC pattern illustrated in FIG. 3 is a 1D pattern. A 1D pattern refers to a pattern with a plurality of features substantially oriented along the same direction. Particularly, each feature (polygon) 58 of the 1D pattern in FIG. 3 spans a first dimension "L" in a first direction (Y direction) and a second dimension "W" in a second direction (X direction) perpendicular to the first direction. The first dimension L is substantially greater than the second dimension W. In other words, the features in the 1D pattern are elongated features oriented in the same direction. In various examples for illustration, the features 58 define fin active regions, gate stacks or metal lines.

Back to FIG. 2, the EUV mask 18 includes first regions 46 and second regions 48. The absorption layer 40 is removed from the second regions 48 (also being referred to as reflective regions), while it remains in the first regions 46 (also being referred to as absorptive regions). As noted above, the features 58 may be defined in the first regions 46 in some embodiments, or alternatively defined in the second regions 48 in other embodiments. In one embodiment, at least one of the reflective regions 48 includes a phase-defect region 50. The phase-defect region 50 is due to the presence of the defect 42 beneath or embedded in the ML 34. The phase-defect region 50 may have a small impact on the amplitude of a light diffracted from the reflective region 48 where the phase-defect region 50 is located. However, it can have large impact on the phase of the light. In fact, a relatively small phase error, e.g., 20°, can have a prominent impact on the lithographic process window or even cause patterning fidelity problems. Therefore, a defect-free LTEM substrate 30 and a defect-free ML 34 are desired. However, this puts constraints in a mask fabrication and may make the mask fabrication more expensive. The depicted disclosure provides an approach to reduce impacts of phase defects.

Figure 4:
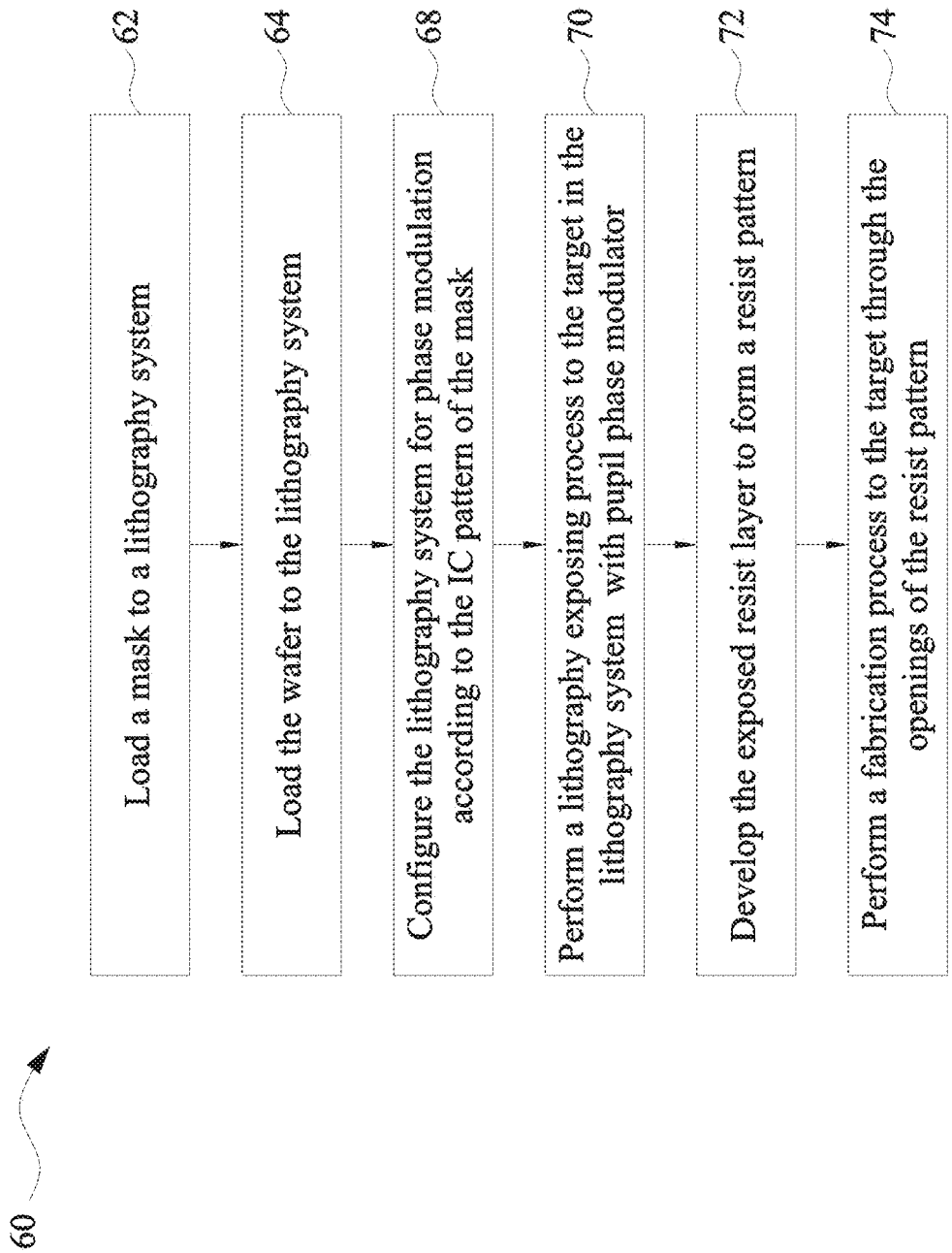
FIG. 4 is a flowchart of a lithography process constructed in accordance with some embodiments.

FIG. 4 is a flowchart of a method 60 to perform a lithography process in an integrated circuit fabrication constructed according to aspects of the present disclosure in accordance with some embodiments. The method 60 is described with reference to FIGS. 1-4 and other figures.

Referring to FIG. 4, the method 60 includes an operation 62 by loading to the lithography system 10 with the mask 18. In the present embodiment, the mask 18 includes a 1D pattern with plurality of features 58 oriented along the same direction, such as illustrated in FIG. 3. The operation 62 may further include other steps, such as orientation and alignment after the mask 18 is secured on the mask stage 16. Thus the 1D IC pattern is oriented properly when it is secured on the mask stage 16. In the present embodiment, assuming the 1D IC pattern is in a X-Y plane when the mask 18 is secured on the mask stage 16, the elongated features 58 in the 1D IC pattern are oriented on the Y direction.

Referring to FIG. 4, the method 60 also includes an operation 64 by loading a target to the substrate stage 28 of the lithography system 10. In the present embodiment, the target is a semiconductor substrate, such as the wafer 26. The wafer 26 is coated with a resist layer that is sensitive to the EUV light, prior to the operation 64. In some embodiment, the resist layer is formed on the wafer 26 by spin-on coating and may be further baked by a suitable baking process, such as soft baking. The resist layer is positive-tone or negative tone in various embodiments.

The illuminator 14 may be set in any suitable mode. In some embodiments, the illuminator 14 is set in a highly coherent illumination mode. The highly coherent illumination mode may be achieved by a mechanism, like an aperture with a certain pattern, such as dipole, quasar, or disk, constructed according to various examples. The aperture is configured at the illuminator stage to achieve the highly coherent illumination mode. However, the aperture will cause the EUV radiation loss and the effect may be achieved by other mechanism. In the present embodiment, the illuminator 14 includes various tunable mirrors or mirrors with other suitable mechanism to tune the reflections of the EUV light from those mirrors. In furtherance of the present embodiment, the highly coherent illumination mode is achieved by configuring the tunable mirrors in the illumination stage. In some embodiments, the highly coherent illumination is on-axis illumination (such as disk or annular illumination pattern) or alternatively off-axis illumination (such as dipole or quadrupole illumination pattern).

FIG. 5 illustrates an embodiment of an illumination pattern 104 designed to achieve off-axis illumination. The illumination pattern 104 includes reflective regions 106 and blocking regions 108. The illumination pattern 104 is further defined by a parameter $\sigma_c$, which is the radius of the reflected portion 106, evaluated relative to NA that is the numerical aperture. The parameter $\sigma_c$ is designed to be less enough to have high coherence and greater enough to have certain intensity. In some embodiments, the parameter $\sigma_c$ is chosen to be less than about 0.3, which means that $\sigma_c/NA$ is less than about 0.3.

In some embodiments, the illumination pattern is determined based on the 1D pattern defined on the mask 18 for imaging enhancement. For example, the 1D pattern illustrated in FIG. 3 includes elongated features oriented in the Y direction, and the corresponding illumination pattern, such as a dipole illumination pattern having dipole reflective regions spanning in the X direction. In furtherance of the embodiment, the parameter $\sigma_c$ is determined according to the pitch of the 1D pattern.

Referring back to FIG. 4, the method 60 includes an operation 68 by configuring the lithography system 10 to achieve phase modulation to the light diffracted from the mask 18. In some embodiments, the phase modulation utilized by the pupil phase modulator 22. As noted above, the pupil phase modulator 22 modulates optical phase of the light directed from the mask 18 so that the light has a proper phase distribution on a projection pupil plane 24. The pupil phase modulator 22 provides a mechanism to modulate the optical phase of the light on the projection pupil plane 24. In some embodiments, the pupil phase modulator 22 includes a mechanism to tune (such as reconfigure) the reflective mirrors of the POB 20 for phase modulation. For example, the mirrors of the POB 20 are tunable and are controlled to reflect the EUV light, thereby modulating the phase of the light through the POB 20. In furtherance of the embodiments, the pupil phase modulator 22 includes controlling circuit, control mechanic components, software, hardware and other features integrated together to be operable to control the reflective mirrors of the POB 20 for desired phase modulation.

The pupil phase modulator 22 is designed and operable to modulate the optical phase of the light, thereby providing a phase distribution of the light on the projection pupil plane 24 such that a mask defect is not printable during a lithography exposing process while the IC pattern defined on the mask 18 remains printable with enough contrast and resolution. The non-printability of a mask defect means that the mask defect is not properly imaged on the wafer (or the resist layer coated on the wafer) during the lithography exposing process so that a corresponding patterned resist layer has no feature associated with the mask defect when the exposed resist layer is developed to form the patterned resist layer.

Particularly, thus achieved phase distribution on the projection pupil plane is designed such that a mask defect is defocused, therefore being not printable. FIG. 6 illustrates a phase distribution 112 on the projection pupil plane, constructed in accordance with some embodiments. The phase distribution 112 is generated on the projection pupil plane by the pupil phase modulator 22 during a lithography exposing process. The phase distribution 112 modulates the image of the mask 18 such that the 1D IC pattern of the mask 18 is imaged on the target 26 but two dimensional (2D) features will be degraded due to the defocusing effect of the pupil phase modulator 22. That leads to non-printability of defects (such as the phase defects 42 in FIG. 2) since a mask defect is usually two dimensional as being randomly shaped and oriented. Statistically, a mask defect is most likely two dimensional as it is randomly shaped. Even a mask defect is one dimensional but is randomly oriented. The 1D defect, as randomly oriented, is less likely oriented in the same direction (the Y direction in FIG. 3) of the 1D IC pattern in the mask 18 but most likely oriented in a direction having both an X component and a Y component. Thus, the 1D defect is also defocused due to the X component.

In various embodiments, the phase distribution 112 may be directly achieved by a physical pupil filter with the designed phase shift distribution or alternatively achieved by other suitable mechanism. In the present embodiment, the POB 20 includes various tunable mirrors or mirrors with other suitable mechanism to tune the optical phase of the EUV light from those mirrors. In furtherance of the present embodiment, the phase distribution 112 is achieved by controlling the tunable mirrors in the POB 20 such that the EUV light is directed to the projection pupil plane with proper phase shift across the projection pupil plane.

The phase distribution 112 is determined by the respective IC pattern of the mask 18 (or simply referred to as mask pattern). In the present embodiment, the IC pattern is a 1D pattern, as illustrated in FIG. 3. In furtherance of the embodiment, the 1D IC pattern of the mask 18 (as illustrated in FIG. 3) includes elongated IC features oriented in the Y direction when the mask 18 is loaded and secured on the mask stage 16, and the corresponding phase distribution 112 has a phase variation along the Y direction and remains unchanged (or substantially unchanged) over the X direction. In other words, the phase function has a gradient that is parallel with the orientation of the elongated features of the 1D IC pattern, or along the Y direction in the present embodiment.

Still referring to FIG. 6, taking a point location (x,y) 114 on the projection pupil plane 24 as an example, the optical phase $\varphi$ at the location (x, y) is substantially a function of the coordinate parameter y, or formulated as $\varphi(y)$. The phase function $\varphi(y)$ defines the phase distribution 112 on the projection pupil plane 24. A proper constructed phase function $\varphi(y)$ by the pupil phase modulator 22 is capable of effectively defocusing the mask defect(s) (leading to the non-printability of the mask defects) while the 1D IC pattern is properly imaged (printed) during the lithography exposing process with enough resolution and contrast. In some embodiments, the optical phase $\varphi(y)$ gradually varies along the Y direction. In the present embodiment, the coordinate parameter y is measured from the center of the projection pupil plane. The phase function $\varphi(y)$ may be s a linear (such as illustrated in FIG. 7) or alternatively a non-linear. The phase function $\varphi(y)$ is tuned such that the defects are defocused and not printable without degrading the imaging effect of the 1D IC pattern. The phase function may be determined according to the IC pattern of the mask 18, by simulation or experiment, to effectively defocus the defects without degrading the IC pattern.

In the present embodiment, the phase function $\varphi$ is defined in a formula as $\varphi=a_1 Z_4+a_2 Z_5$. $Z_4$ and $Z_5$ are two terms in in Zernike polynomials, particularly, the fourth and fifth terms, respectively. Specifically, the fourth term $Z_4$ is defined as $(2\rho^2-1)$ and the fifth term $Z_5$ is defined as $\rho^2 \cos(2\theta)$, where $\rho$ is the radial coordinate ranging from 0 to 1, and $\theta$ is the azimuthal component ranging from 0 to $2\pi$. Furthermore, the coefficients $a_1$ and $a_2$ are tunable constant for optimized effect to reducing the printability of the defects on the mask. Thus the phase function is dominated by the terms $Z_4$ and $Z_5$. $Z_4$ causes an overall defocus in all direction. This aberration can be modified by changing the best focus position when a wafer is exposed without degradation of the image qualities to the IC pattern. $Z_5$ is an astigmatism term which causes best focus of x and y direction separately. For example, the best focus of x-direction shifts by +30 nm while the best focus of y-direction shifts by −30 nm. Generally $\varphi$ is a function of x and y. By constraining the phase function $\varphi$ as a function $Z_4$ and $Z_5$, the phase function $\varphi$ is substantially a function of y. By adjusting $a_2$, the phase function $\varphi$ can be tuned to effectively defocus the defects without degrading the IC pattern.

In one example, the phase function $\varphi$ is tuned and defined as phase function $\varphi=Z_4-2Z_5$. Thus defined phase function $Z_4-2Z_5$ is able to keep the best focus of x-direction in a constant level and shift away from the best focus of y-direction. In tuning the phase function, changing of $Z_5$ term is necessary but $Z_4$ term is optional because the function of $Z_4$ is to adjust the all over focus position. If the phase distribution is a superposition of $Z_4$ and $Z_5$, there won't be pitch-dependent defocus in either x-direction or y-direction.

FIG. 8 illustrates a phase distribution 112 on the projection pupil plane 24, constructed in accordance with some embodiments. The phase distribution 112 is defined by the phase function $\varphi=Z_4-2Z_5$. In FIG. 8, the gray scale represents optical phase $\varphi$. The horizontal axis is the X direction and the vertical axis is the Y direction. The coordinate origin (0, 0) is the center of the phase pupil filter. The phase pattern defined in the phase distribution $\varphi$ extends to the edges of the numerical aperture, particularly, from −1 to +1 in X and Y directions, respectively. Here the X and Y are represented in a scale relative to the numerical aperture (NA). The optical phase pattern in FIG. 8 describes a phase distribution in the projection pupil plane that has phase variation along the Y direction and substantially no phase shift along the X direction. Accordingly, the phase distribution 112 by the pupil phase modulator causes the defocus of the features extended in the X direction but not features extended in the Y direction. The 1D IC pattern oriented in the Y direction remains without degradation (or tolerable degradation) but defects will be defocused and are not printable during the corresponding lithography exposing process.

As noted above, the phase function $\varphi$ is determined according to the IC pattern by simulation and/or experiment, to effectively defocus the mask defects without degrading the IC pattern. Particularly, the phase function $\varphi$ in the projection pupil plane has a gradient in parallel with the orientation of the elongated features of the 1D IC pattern on the mask, thereby effectively defocusing the mask defects. In some embodiments, the defocus (offset distance of the depth of focus) is used as an index in tuning and optimizing the phase function $\varphi$ to reduce the printability of the defects while sustain the imaging quality of the IC pattern.

Referring back to FIG. 4, the method 60 proceeds to operation 70 by performing a lithography exposing process to the target 26 in the lithography system 10 with the pupil phase modulator 22. The phase modulation to the light directed from the mask 18 at the operation 68 remains through the lithography exposing process. During the lithography exposing process, EUV light diffracted from the mask 18 is modulated at the projection pupil plane 24 by the pupil phase modulator 22 with the optical phase distribution to defocus the defects of the mask; is directed to the target 26 to form a latent image of the IC pattern on the resist layer of the target 26 while the defects of the mask 18 are substantially eliminated from the latent image.

In some embodiments, the EUV light, prior to be directed to the mask 18, is also modulated at the illumination pupil plane by the illuminator 14 with the EUV energy distribution for proper illumination mode (such as an on-axis illumination or an off-axis illumination mode described above) during the lithography exposing process.

Thus implemented lithography exposing process can properly image the IC patent and defocus the mask defect(s) such that they are not printable. The operations 68 and 70 are further described with one example below.

Figure 9:
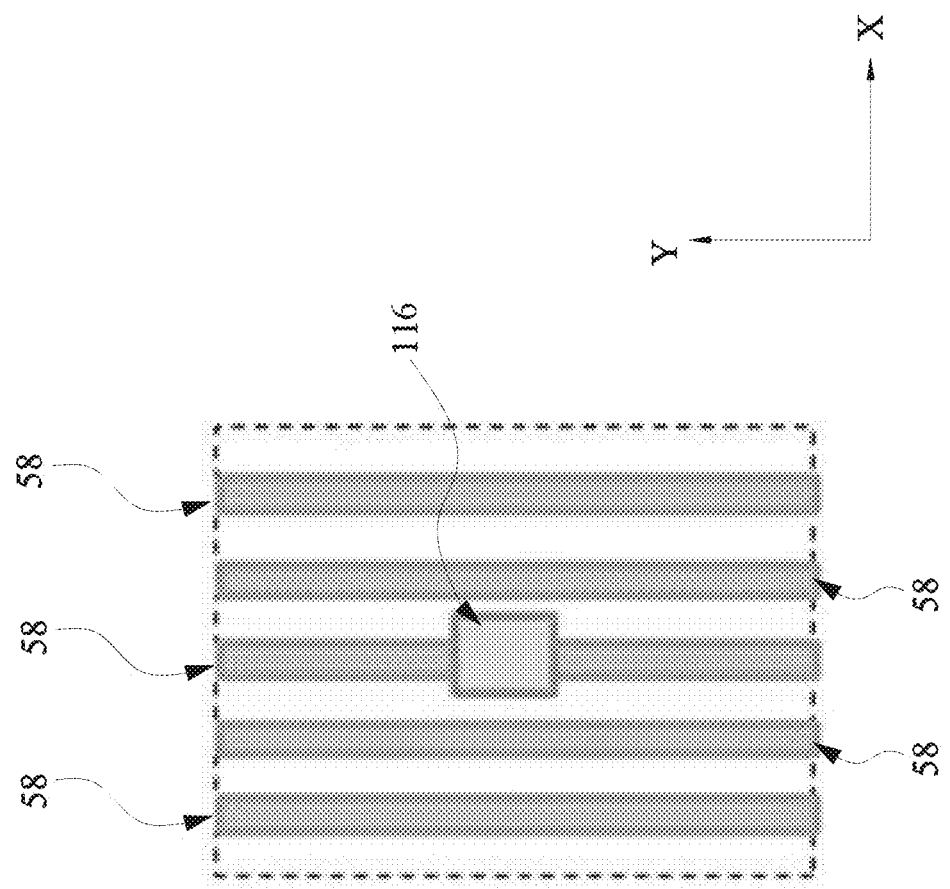
FIG. 9 is a diagrammatic top view of a mask, constructed in accordance with some embodiments.

FIG. 9 illustrates a top view of a mask 18 constructed in accordance with some embodiments. The mask 18 includes a 1D IC pattern having a plurality of polygons 58 oriented in parallel along Y direction. The mask 18 further includes an exemplary mask defect 116. In some embodiments, the mask defect 116 is similar to the defect 42 as phase defect. In one embodiment, the polygons 58 are absorptive and the rest portions are reflective to the EUV light. In an alternative embodiment, the polygons 58 are reflective and the rest portions are absorptive.

Figure 10A:
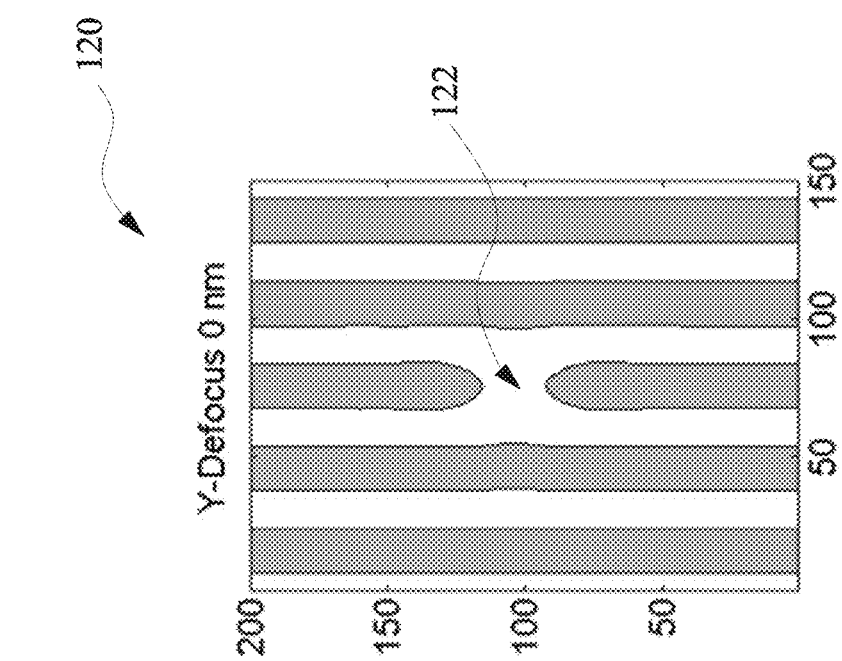

FIG. 10A illustrates a latent image 120 of the mask 18 on the target 26 by a lithography exposing process without using the pupil phase modulator 22 (or without defocusing). The latent image 120 is formed on the resist layer by the corresponding lithography process at the operation 70. The latent image 120 on the resist layer corresponds to the exposed portions of the resist layer with exposure dose greater than the exposure dose threshold of the resist and is chemically changed, which will result in a patterned resist layer corresponding to the latent image 120 by a developing process. In one embodiment when the latent image 120 corresponds to the reflective portion and the resist layer is positive tone, the portion of the resist layer corresponding to the latent image 120 is removed while the other resist portion remains. In another embodiment when the latent image 120 corresponds to the absorptive and the resist layer is negative tone, the portion of the resist layer corresponding to the latent image 120 is removed while the rest portion remains. In another embodiment where the latent image 120 corresponds to the reflective and the resist layer is positive tone, the portion of the resist layer corresponding to the latent image 120 remains while the resist portion is removed. The latent image 120 further includes a defect 122 transferred from the mask defect 119, causing short or open issue in the final pattern. For FIG. 11A and following figures, the defocus is caused by the phase change along the Y direction on the projection pupil plane and the corresponding defocus is referred to as Y-defocus in those figures.

FIGS. 10B-10K illustrates various latent image of the mask 18 of FIG. 9 by the lithography exposing process utilizing the pupil phase modulator 22 designed to achieve various defocus values, ranging from 20 nm (in FIG. 10B) to 200 nm (in FIG. 10K). In some embodiments, the phase distribution 112 generated by the pupil phase modulator 22 is defined by the phase function $\varphi=a_1 Z_4+a_2 Z_5$. Those figures show that when the defocus is in the range from about 100 nm to about 200 nm, the defect 122 is eliminated from the latent image. The corresponding phase function $\varphi$ is properly tuned such that the defocus is greater enough to eliminate the mask defect from the latent image while the IC pattern is properly formed on the resist layer.

Referring back to FIG. 4, the method 60 may include an operation 72 by developing the exposed resist layer coated on the target 26, thereby forming a patterned resist layer with one or more openings corresponding to the IC pattern defined on the mask 18. The method 60 may further include a post exposure baking (PEB) process between the lithography exposing process and the developing process.

Figure 11:
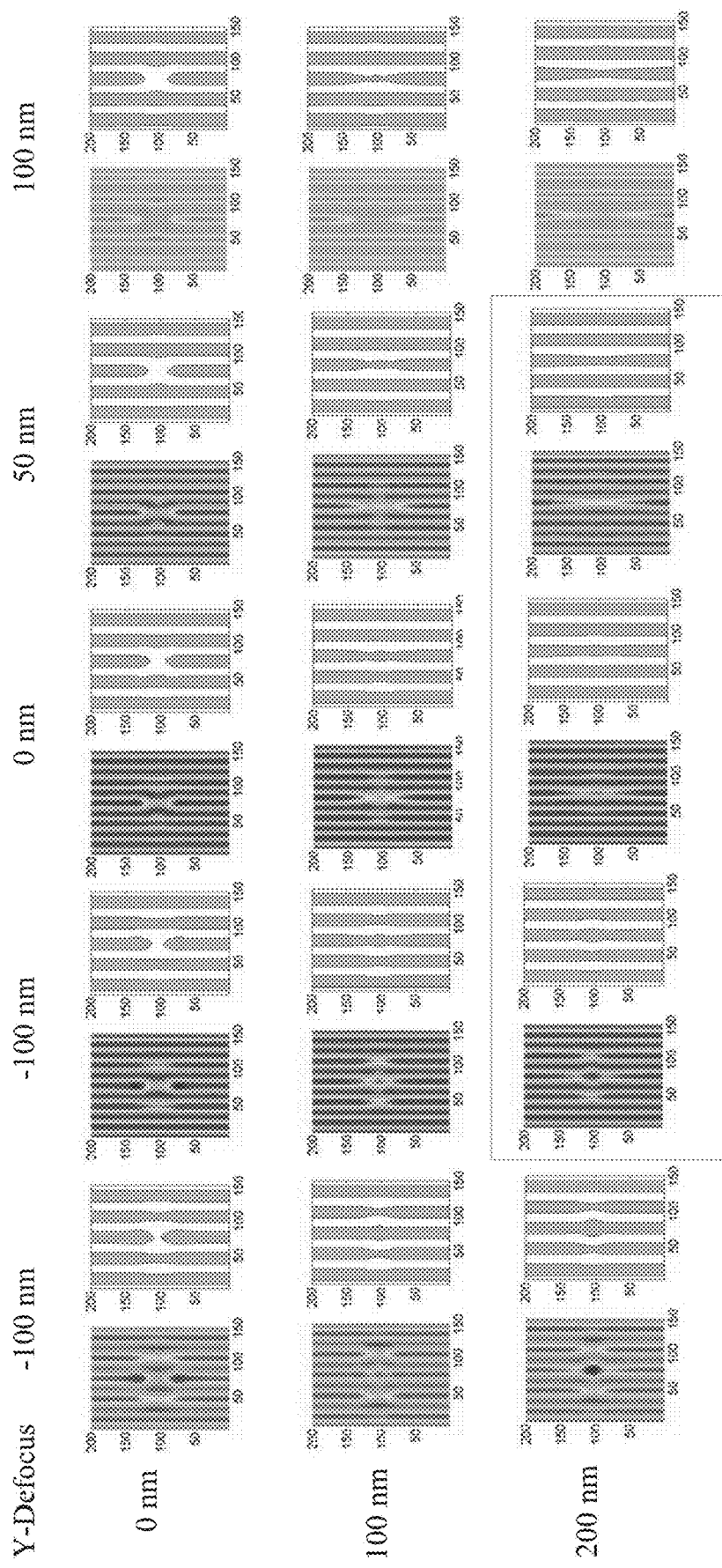
FIG. 11 illustrates various latent images and resist patterns, constructed in accordance with some embodiments.

Another example is provided to further describe various operations in the method 60. FIG. 11 illustrates a plurality of patterns, constructed in accordance with some embodiments. FIG. 11 includes 15 pairs of images, each pair including a latent image (left one) of the mask 18 by the lithography exposing process and a patterned resist (right one) by the developing process. On left of the images, the corresponding Y-defocus by pupil phase modulator 22 utilized in the lithography exposing process is 0 nm for the five pairs of the images in the first row, 100 nm for the five pairs of the images in the second row, and 200 nm for the five pairs of the images in the third row, respectively. On the top, numbers are defocus caused by focus shifting of the optical module of the lithography system 10. Those defocuses are same to both X direction and Y direction. Particularly, those defocuses are −100 nm for the pairs in the first column, −50 nm for the pairs in the second column, 0 nm for the pairs in the third column, 50 nm for the pairs in the fourth column, and 100 nm for the pairs in the fifth column, respectively. The three pairs in the box 126 have the resist patterns where the defect is not printed or eliminated. This further shows that the lithography exposing process using the pupil phase modulator 22 can eliminate mask defects and has large process window. In this particular example, even the focus of the lithography system is off from about −50 nm to about +50 nm, the lithography exposing process using the pupil phase modulator 22 can eliminate mask defects and has good imaging quality of the IC pattern.

Back to the method 60 in FIG. 4, additional steps may be implemented before, during, and after the method 60, and some of the steps described may be replaced, eliminated, or moved around for additional embodiments of the method 60.

After the developing process at the operation 72, the method 60 may further include an operation 74 by performing a fabrication process to the target 26 through the patterned resist layer. In one embodiment, the semiconductor wafer or a material layer of the target is etched through the openings of the patterned resist layer, thereby transferring the IC pattern to the substrate or the underlying material layer. In one example, the semiconductor wafer is etched to form a plurality of fin-like active regions. In another example, the underlying material layer is an interlayer dielectric (ILD) layer disposed on the semiconductor substrate. The etching process will form a plurality of trenches in the ILD layer and metal lines are subsequently formed in the trenches by a procedure, such as the procedure that includes metal deposition and chemical mechanical polishing (CMP). In yet another example, the underlying material layer includes a gate electrode material layer. The etching process will form a plurality of gates.

Various embodiments of the method 60, the lithography system 10 and the mask 18 are described according to various aspects of the present disclosure. Other alternatives and modifications may present without departure from the spirit of the present disclosure.

The IC pattern defined on the mask 18 as illustrated in FIG. 3 is a 1D pattern. However, the IC pattern is not limited to a complete 1D IC pattern. For example, the IC pattern is substantially one dimensional and most polygons in the IC pattern are oriented in the same direction but some non-critical features (such as dummy features) may be oriented in different directions and/or be 2D features. In another example, most polygons in the IC pattern are oriented in the same direction but some polygons may be oriented in direction(s) slightly off that direction.

In some embodiments, the mask 18 includes an IC pattern having a plurality of polygons disposed in multiple regions. A subset of polygons on a same region is oriented along a same direction, referred to as a region direction. However, the region directions may be different from each other. For example, a first subset of polygons on a first region is oriented along a first direction and a second subset of polygons on a second region is oriented along a second direction that is different from the first direction. In one particular example, the first subset of polygons is oriented along the X direction and the second subset of polygons is oriented along the Y direction.

The mask with such an IC pattern may be used in the method 60 and still achieves the similar advantages with pupil phase modulator. The method 60 may be extended to accommodate the mask with multiple region directions. Assuming the mask includes the first region and the second region. When the mask is secured on the mask stage at the operation 62, the first subset of polygons in the first region is oriented along the X direction and the second subset of polygons in the second region is oriented along the Y direction. In some embodiments, the operations 68 and 70 may be repeated several times (cycles) for various regions, respectively. The method 60 includes a first cycle to the first region. Particularly, in the first cycle, the method 60 includes configuring the lithography system such that the pupil phase modulator generates a first phase distribution on the projection pupil plane, wherein the first phase distribution has a phase gradient along the X direction. Then the method 60 proceeds to perform a first lithography exposing process to image the first subset of polygons in the first region of the mask to the target. Then the method 60 proceeds to a second cycle to the second region. In the second cycle, the method 60 includes configuring the lithography system such that the pupil phase modulator generates a second phase distribution on the projection pupil plane, wherein the second phase distribution has a phase gradient along the Y direction. Then the method 60 proceeds to perform a second lithography exposing process to image the second subset of polygons in the second region of the mask to the target. Thus, the pupil phase modulator dynamically controls the phase distribution on the projection pupil plane according to the orientation of the polygons to be imaged during the lithography exposing process, thereby defocusing the mask defects and rendering the mask defects not printable.

In some embodiments, the method 60 is not limited to the EUV lithography process. For example, the radiation source 12 of the lithography system 10 generates ultraviolet (UV) light or deep UV (DUV). In furtherance of the example, the radiation source 12 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength. Accordingly, the mask 18 and the optical components of the lithography system 10 are transmissive. In another example, the radiation source 12 includes a Fluoride ($F_2$) excimer laser with a wavelength of 157 nm.

In some embodiment, the pupil phase modulator 22 is designed to modulate both the intensity and optical phase of the light at the projection pupil plane, in order to effectively reducing the printability of the mask defects. In some embodiments, the illumination pattern is designed according to the pitch of the 1D IC pattern defined on the mask 18. In some embodiments, the IC pattern defined on the mask 18 may further include various assist polygons incorporated by an OPC process and/or dummy polygons incorporated for processing consideration. In some embodiments, the resist material is a positive tone resist or a negative tone resist.

Based on the above, the present disclosure presents a lithography system and a method that employ a pupil phase modulator 22 to expose a mask, thereby defocusing the defects of the mask and reducing the printability of the defects. The pupil phase modulator is designed to modulate the optical phase distribution of the light on the projection pupil plane to selectively defocusing the mask defects (if any) while the 1D IC pattern defined on the mask is imaged on the target without degradation.

Various advantages may present in different embodiments of the present disclosure. The lithography system and process may therefore employ a mask having defects. The lithography system and process demonstrates significantly reduction of defect printability. Accordingly, the expensive procedure to repair defective masks can be reduced or eliminated at least for certain masks, such as the mask with one dimensional IC pattern. Additional cost associated with mask repairing, mask scrap and/or wafer yield reduction is substantially reduced.

Thus, the present disclosure provides one embodiment of a method. The method includes loading a mask to a lithography system, wherein the mask includes an one-dimensional integrated circuit (1D IC) pattern; utilizing a pupil phase modulator in the lithography system to modulate phase of light diffracted from the mask; and performing a lithography exposing process to a target in the lithography system with the mask and the pupil phase modulator.

The present disclosure also provides a method in accordance with some embodiments. The method includes loading a mask to a lithography system, wherein the mask includes a first one-dimensional integrated circuit (1D IC) pattern; configuring the lithography system such that to module a phase distribution of light diffracted from the mask on a projection pupil plane in a way to reduce printability of a mask defect; and performing a first lithography exposing process to image the first 1D IC pattern to a target by the configured lithography system.

The present disclosure also provides a method in accordance with some embodiments. The method includes loading an extreme ultraviolet (EUV) mask to a lithography system, wherein the mask includes an integrated circuit (IC) pattern; controlling a plurality of reflective mirrors in a projection optics box of the lithography system such that to modulate a phase distribution of light diffracted from the EUV mask, wherein the modulated phase distribution is determined according to the IC pattern; and performing a lithography exposing process to a target in the lithography system with the EUV mask and the configured plurality of reflective mirrors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system comprising:
   a wafer stage for securing a target;
   a mask stage for securing a mask that includes a mask pattern having a plurality of features oriented substantially along a first direction; and
   an imaging module for directing light to the mask and imaging the mask pattern on the target by modulating a phase of light diffracted from the mask, such that a phase distribution of the light diffracted from the mask varies substantially along the first direction but does not vary substantially along a second direction that is substantially perpendicular to the first direction.

2. The lithography system of claim 1, wherein the imaging module includes a plurality of reflective mirrors for modulating the phase of light diffracted from the mask onto a projection pupil plane.

3. The lithography system of claim 1, wherein the imaging module includes a pupil filter for filtering out specific spatial frequency components of the light diffracted from the mask.

4. The lithography system of claim 1, further comprising:
   a radiation source for generating light; and
   wherein the imaging module includes a plurality of mirrors for reflecting light generated from the radiation source to the mask.

5. The lithography system of claim 1, wherein the phase distribution is defined by a phase function $\varphi$, wherein the phase function $\varphi$ includes an astigmatism term that separates a best focus of the first direction along which the plurality of features are substantially oriented and a best focus of the second direction, wherein a defect in the mask is oriented in both the first direction and at least partially in the second direction.

6. The lithography system of claim 5, wherein the phase function $\varphi$ is constrained as a function of a fourth term Zernike polynomial Z4 and a fifth term Zernike polynomial Z5.

7. The lithography system of claim 6, wherein the phase function $\varphi=Z4-2Z5$, Z4 being a term for adjusting focus in all directions simultaneously and Z5 being the astigmatism term for separating the best focus in the first direction from the best focus in the second direction.

8. The lithography system of claim 1, wherein the imaging module includes reflective optics for imaging the mask pattern on the target.

9. The lithography system of claim 1, wherein the imaging module includes refractive optics for imaging the mask pattern on the target.

10. A lithography system comprising:
a wafer stage for securing a target;
a mask stage for securing a mask, wherein the mask includes a mask pattern having polygons that are oriented substantially along a first direction; and
an imaging module for imaging the polygons on the target, wherein the imaging module modulates a phase distribution of light diffracted from the mask on a projection pupil plane during an exposure process to defocus any mask defect oriented at least partially along both the first direction and a second direction that is different than the first direction.

11. The lithography system of claim 10, wherein:
the polygons are a first set of polygons, the exposure process is a first exposure process, and the mask pattern has a second set of polygons, wherein the second set of polygons are oriented substantially along a third direction; and
the imaging module modulates the phase distribution of the light diffracted from the mask on the projection pupil plane during a second exposure process to defocus any mask defect oriented at least partially along both the third direction and a fourth direction that is different than the third direction.

12. The lithography system of claim 10, wherein the imaging module includes a plurality of reflective mirrors in a projection optics box and the modulating the phase distribution of light diffracted from the mask includes configuring the plurality of reflective mirrors, such that the modulated phase distribution of light has a phase function having a gradient along the first direction.

13. The lithography system of claim 12, wherein the phase function is defined as Z4−2Z5, wherein Z4 is a fourth term Zernike polynomial and Z5 is a fifth term Zernike polynomial Z5, Z4 being a term for adjusting focus in all directions simultaneously and Z5 being a term for separating a best focus in the first direction from a best focus in the second direction.

14. The lithography system of claim 10, further comprising an illuminator for providing on-axis illumination of light to the mask.

15. The lithography system of claim 14, wherein the illuminator is a disk illuminator having partial coherence σ less than or equal to 0.3.

16. The lithography system of claim 10, further comprising an illuminator for providing off-axis illumination of light to the mask.

17. The lithography system of claim 16, wherein the illuminator is a dipole illuminator having partial coherence σ less than or equal to 0.3.

18. A lithography system comprising:
a wafer stage for securing a target;
a mask stage for securing an extreme ultraviolet (EUV) mask that includes a one-dimensional integrated circuit (1D IC) pattern having features oriented substantially in a first direction, wherein the EUV mask further includes a defect oriented in both the first direction and at least partially in a second direction that is substantially perpendicular to the first direction;
an EUV radiation source for generating EUV light;
an illuminator for directing the EUV light to the mask; and
a projection optics box (POB) for imaging the 1D IC pattern on the target, wherein the POB includes a pupil phase modulator that modulates a phase distribution of EUV light diffracted from the EUV mask to prevent the defect in the EUV mask from being printable on the target during a lithography exposing process.

19. The lithography system of claim 18, wherein the pupil phase modulator includes a plurality of reflective mirrors and a control circuit for controlling the plurality of reflective mirrors, wherein the phase distribution of the EUV light diffracted from the EUV mask is modulated by the control circuit configuring the plurality of reflective mirrors, such that the modulated phase distribution of the EUV light has a phase function having a gradient along the first direction.

20. The lithography system of claim 19, wherein the phase distribution of the EUV light has no phase variation along the second direction.

* * * * *